United States Patent
Chen et al.

(10) Patent No.: US 10,312,925 B1
(45) Date of Patent: Jun. 4, 2019

(54) MULTIPLYING DAC OF PIPELINED ADC

(71) Applicant: REALTEK SEMICONDUCTOR CORPORATION, Hsinchu (TW)

(72) Inventors: Chih-Lung Chen, Hsinchu County (TW); Ying-Cheng Wu, Hsinchu County (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/105,142

(22) Filed: Aug. 20, 2018

(30) Foreign Application Priority Data

Nov. 28, 2017 (TW) .............................. 106141309 A (51) Int. Cl.
*H03F 3/45* (2006.01)
*H03M 1/00* (2006.01)
*H03M 1/42* (2006.01)
*H03M 1/44* (2006.01)

(52) U.S. Cl.
CPC ........ *H03M 1/001* (2013.01); *H03F 3/45475* (2013.01); *H03F 2200/129* (2013.01); *H03F 2203/45116* (2013.01); *H03F 2203/45544* (2013.01); *H03M 1/42* (2013.01); *H03M 1/44* (2013.01); *H03M 1/442* (2013.01)

(58) Field of Classification Search
CPC ........... H03F 3/45475; H03F 2200/129; H03F 2203/45116; H03F 2203/45544; H03M 1/42; H03M 1/44; H03M 1/442
USPC .................................. 341/161–163, 172, 110
See application file for complete search history.

(56) References Cited

U.S. PATENT DOCUMENTS

| 7,683,819 B2* | 3/2010 | Kurauchi | ............ H03M 1/1225 |
| | | | 341/118 |
| 7,847,720 B2* | 12/2010 | Chou | .................... H03M 1/002 |
| | | | 341/161 |
| 8,487,803 B1* | 7/2013 | Garrity | ............... H03M 1/1215 |
| | | | 341/161 |

FOREIGN PATENT DOCUMENTS

TW       I454066       9/2014

OTHER PUBLICATIONS

Taiwan Intellectual Property Office, "Office Action", dated Aug. 16, 2018. Summary of the OA letter: The cited reference 1 (TW I454066) renders claims 1-5, 9, and 10 obvious.

(Continued)

*Primary Examiner* — Khai M Nguyen
(74) *Attorney, Agent, or Firm* — WPAT, PC (57) ABSTRACT

This invention discloses a multiplying digital-to-analog converter (MDAC) applied to a pipelined analog-to-digital converter (pipelined ADC). The MDAC includes an operational amplifier. The MDAC samples a differential input signal in a sampling phase and performs subtraction and multiplication operations in an amplification phase according to a first reference voltage and a second reference voltage. The common-mode voltage of the first reference voltage and the second reference voltage is not substantially equal to the common-mode voltage of the differential input signal; and/or the voltage difference between the first reference voltage and the second reference voltage is not substantially equal to one half of an allowed maximum peak-to-peak value of the differential input signal. One of the first reference voltage and the second reference voltage can be ground.

15 Claims, 9 Drawing Sheets

(56) References Cited

OTHER PUBLICATIONS

H. Yu, S. W. Chin, B. C. Wong "A 12b 50MSPS 34mW Pipelined ADC" IEEE 2008 Custom Intergrated Circuits Conference (CICC).

* cited by examiner

MULTIPLYING DAC OF PIPELINED ADC

BACKGROUND OF THE INVENTION

1. Field of the Invention

The present invention generally relates to a pipelined analog-to-digital converter (pipelined ADC, also known as a pipeline ADC), and, more particularly, to a multiplying digital-to-analog converter (multiplying DAC, hereinafter referred to as MDAC) of a pipelined ADC.

2. Description of Related Art

Figure 1:
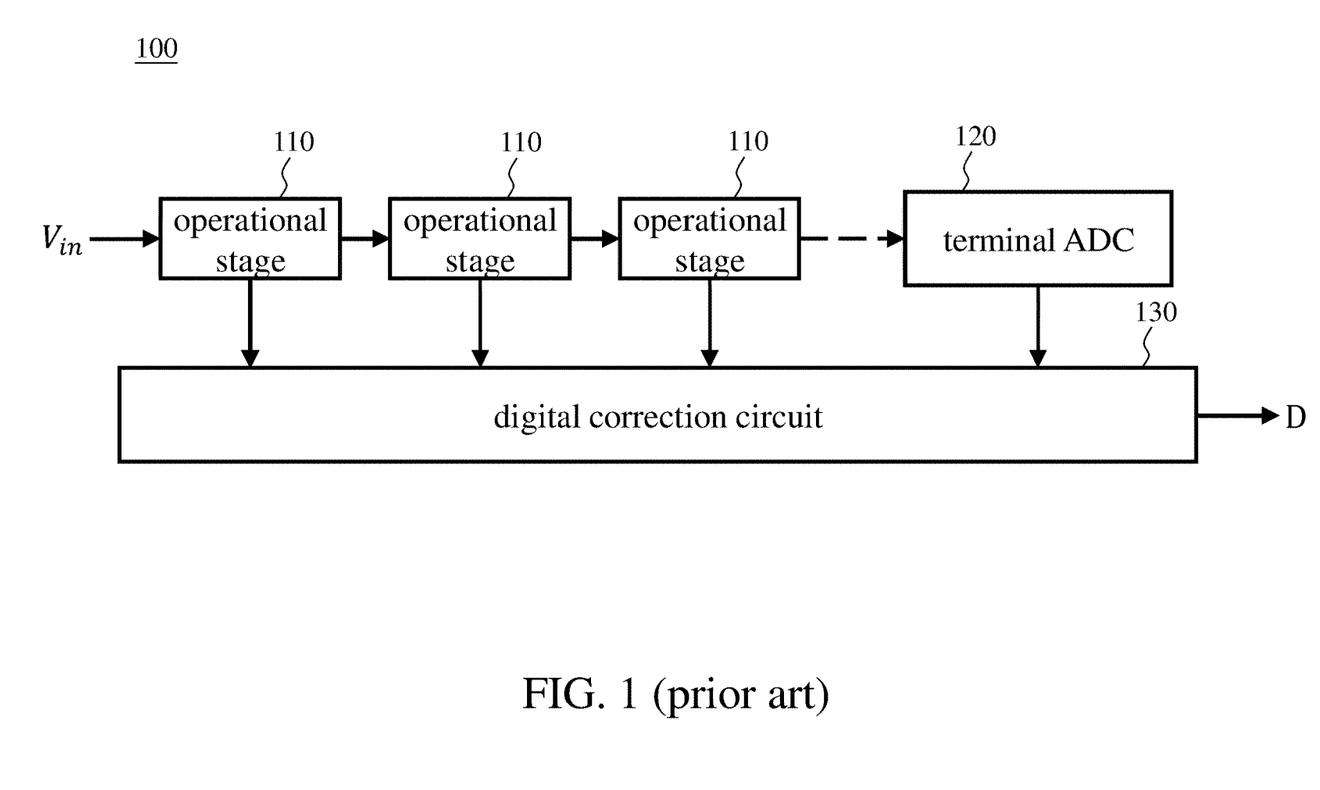
FIG. 1 illustrates a conventional pipelined analog-to-digital converter.

FIG. 1 is a conventional pipelined analog-to-digital converter (pipelined ADC) 100 including a plurality of series-connected operational stages 110, a terminal ADC 120, and a digital correction circuit 130. After the differential input signal $V_{in}$ is processed by multiple operational stages in which comparison, subtraction, and amplification operations are conducted, the correction circuit 130 finally corrects the output of each operational stage 110 and the output of the terminal ADC 120 to generate a digital code D, which is the result the analog-to-digital conversion of the differential input signal $V_{in}$. The operation principles of the pipelined ADC 100 are well known to those of ordinary skill in the art and thus omitted for brevity.

Figure 2:
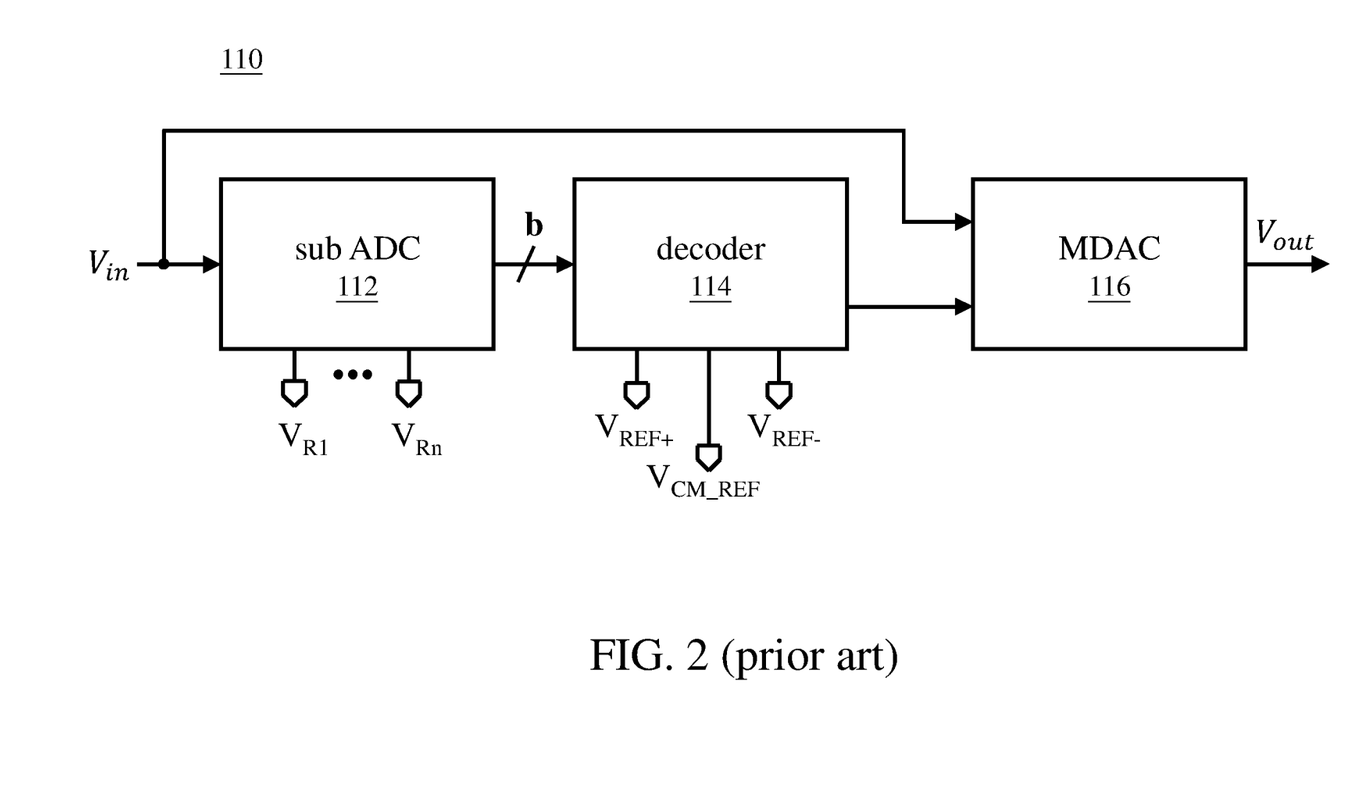
FIG. 2 illustrates a functional block diagram of one of the operational stages of FIG. 1.

FIG. 2 is a functional block diagram of one of the operational stages 110 of FIG. 1. The operational stage 110 includes a sub ADC 112, a decoder 114, and an MDAC 116. The sub ADC 112 includes a plurality of comparators that compare the differential input signal $V_{in}$ with multiple predetermined voltages $V_{R1}$ to $V_{Rn}$ to thereby generate a digital signal b. The number of comparators and the number of predetermined voltages (i.e., the numeral n) are related to the number of bits of the pipelined ADC 100. The decoder 114 provides the reference voltage $V_{REF+}$, the reference voltage $V_{REF-}$, and/or the voltage $V_{CM\_REF}$ to the MDAC 116 according to the digital signal b. The voltage $V_{CM\_REF}$ is a common-mode voltage of the reference voltage $V_{REF+}$ and the reference voltage $V_{REF-}$. The MDAC 116 samples the differential input signal $V_{in}$ and performs subtraction and multiplication on the differential input signal $V_{in}$ according to the voltages provided by the decoder 114 to thereby output the differential output signal $V_{out}$. The differential output signal $V_{out}$ becomes the differential input signal of the following operational stage 110 or the terminal ADC 120.

Figure 3:
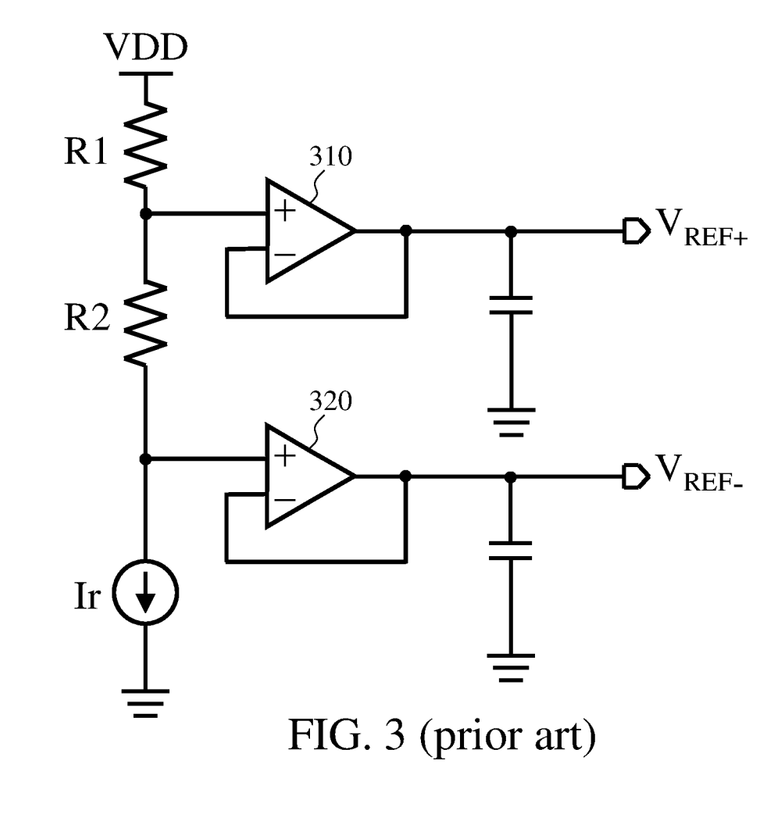
FIG. 3 illustrates a conventional circuit diagram for generating the reference voltage $V_{REF+}$ and the reference voltage $V_{REF-}$.

To ensure a stable operation of the pipelined ADC 100, the voltage $V_{CM\_REF}$ should ideally be equal to the common-mode voltage $V_{CM\_PGA}$ of the differential input signal $V_{in}$, and the voltage difference between the reference voltage $V_{REF+}$ and the reference voltage $V_{REF-}$ is generally half of the allowed maximum peak-to-peak value $V_{pp\_max}$ of the differential input signal $V_{in}$. For example, if the differential input signal $V_{in}$ is limited between VDD and ground (i.e., $V_{pp\_max}$=VDD−0=VDD), then $V_{REF+}-V_{REF-}=0.5V_{pp\_max}=0.5$VDD and $V_{CM\_REF}=V_{CM\_PGA}=0.5$VDD. FIG. 3 is a conventional circuit diagram for generating the reference voltage $V_{REF+}$ and the reference voltage $V_{REF-}$. This circuit is well known to those of ordinary skill in the art and its details are not discussed herein for brevity. In order to satisfy the above requirements, the prior art often makes $V_{REF+}=0.75$VDD and $V_{REF-}=0.25$VDD by adjusting the resistance values of the resistors R1 and R2 and the current of the current source Ir in FIG. 3. However, the above requirements limit the design flexibility of the reference voltage $V_{REF+}$ and the reference voltage $V_{REF-}$. Furthermore, the unit gain buffers 310 and 320 of FIG. 3 take up considerably large circuit areas.

SUMMARY OF THE INVENTION

In view of the issues of the prior art, an object of the present invention is to provide an MDAC of a pipelined ADC, so as to improve the design flexibility of reference voltages of the MDAC and to further reduce the overall circuit area of the pipelined ADC.

An MDAC applied to a pipelined ADC and operating in a sampling phase or an amplification phase is provided. The MDAC includes an operational amplifier, a first capacitor, a second capacitor, a third capacitor, and a fourth capacitor. The first capacitor has a first end and a second end. The first end is coupled to a first reference voltage in the sampling phase and coupled to a first input terminal of the operational amplifier but not to the first reference voltage in the amplification phase. The second end receives a differential input signal in the sampling phase and is coupled to a first output terminal of the operational amplifier in the amplification phase. The second capacitor has a third end and a fourth end. The third end is coupled to the first reference voltage in the sampling phase and coupled to the first input terminal of the operational amplifier but not to the first reference voltage in the amplification phase. The fourth end receives the differential input signal in the sampling phase and is coupled to a second reference voltage in the amplification phase. The third capacitor has a fifth end and a sixth end. The fifth end is coupled to the first reference voltage in the sampling phase and coupled to a second input terminal of the operational amplifier but not to the first reference voltage in the amplification phase. The sixth end receives the differential input signal in the sampling phase and is coupled to a second output terminal of the operational amplifier in the amplification phase. The fourth capacitor has a seventh end and an eighth end. The seventh end is coupled to the first reference voltage in the sampling phase and coupled to the second input terminal of the operational amplifier but not to the first reference voltage in the amplification phase. The eighth end receives the differential input signal in the sampling phase and is coupled to a third reference voltage in the amplification phase. One of the second reference voltage and the third reference voltage is substantially ground.

An MDAC applied to a pipelined ADC and operating in a sampling phase or an amplification phase is also provided. The MDAC includes an operational amplifier, a first capacitor, a second capacitor, a third capacitor, and a fourth capacitor. The first capacitor has a first end and a second end. The first end is coupled to a first reference voltage in the sampling phase and coupled to a first input terminal of the operational amplifier but not to the first reference voltage in the amplification phase. The second end receives a differential input signal in the sampling phase and is coupled to a first output terminal of the operational amplifier in the amplification phase. The second capacitor has a third end and a fourth end. The third end is coupled to the first reference voltage in the sampling phase and coupled to the first input terminal of the operational amplifier but not to the first reference voltage in the amplification phase. The fourth end receives the differential input signal in the sampling phase and is coupled to a second reference voltage in the amplification phase. The third capacitor has a fifth end and a sixth end. The fifth end is coupled to the first reference voltage in the sampling phase and coupled to a second input terminal of the operational amplifier but not to the first reference voltage in the amplification phase. The sixth end receives the differential input signal in the sampling phase and is coupled to a second output terminal of the operational amplifier in the amplification phase. The fourth capacitor has a seventh end and an eighth end. The seventh end is coupled to the first reference voltage in the sampling phase and coupled to the second input terminal of the operational amplifier but not to the first reference voltage in the amplification phase. The eighth end receives the differential input signal in the sampling phase and is coupled to a third reference voltage in the amplification phase. The DC voltages of the first and second input terminals of the operational amplifier in the amplification phase are not substantially equal to the first reference voltage.

An MDAC applied to a pipelined ADC and operating in a sampling phase or an amplification phase is also provided. The MDAC includes an operational amplifier, a first capacitor, a second capacitor, a third capacitor, a fourth capacitor, a fifth capacitor, and a sixth capacitor. The first capacitor has a first end and a second end. The first end is coupled to a first reference voltage in the sampling phase and coupled to a first input terminal of the operational amplifier but not to the first reference voltage in the amplification phase. The second end receives a differential input signal in the sampling phase and is coupled to a first output terminal of the operational amplifier in the amplification phase. The second capacitor has a third end and a fourth end. The third end is coupled to the first reference voltage in the sampling phase and coupled to the first input terminal of the operational amplifier but not to the first reference voltage in the amplification phase. The fourth end receives the differential input signal in the sampling phase and is coupled to a second reference voltage in the amplification phase. The third capacitor has a fifth end and a sixth end. The fifth end is coupled to the first reference voltage in the sampling phase and coupled to a second input terminal of the operational amplifier but not to the first reference voltage in the amplification phase. The sixth end receives the differential input signal in the sampling phase and is coupled to a second output terminal of the operational amplifier in the amplification phase. The fourth capacitor has a seventh end and an eighth end. The seventh end is coupled to the first reference voltage in the sampling phase and coupled to the second input terminal of the operational amplifier but not to the first reference voltage in the amplification phase. The eighth end receives the differential input signal in the sampling phase and is coupled to a third reference voltage in the amplification phase. The fifth capacitor has a ninth end and a tenth end. The ninth end is coupled to the first reference voltage in the sampling phase and coupled to the first input terminal of the operational amplifier but not to the first reference voltage in the amplification phase. The tenth end receives the differential input signal in the sampling phase and is coupled to a common-mode voltage of the second reference voltage and the third reference voltage in the amplification phase. The sixth capacitor has an eleventh end and a twelfth end. The eleventh end is coupled to the first reference voltage in the sampling phase, and is coupled to the second input terminal of the operational amplifier but not to the first reference voltage in the amplification phase. The twelfth end receives the differential input signal in the sampling phase and is coupled to the common-mode voltage in the amplification phase.

The MDAC of the pipelined ADC of the present invention enables shift and scaling of the reference voltages without affecting the operation of the MDAC. Compared with the prior art, the present invention improves the design flexibility of the reference voltages, which can in turn reduce the overall circuit area of the pipelined ADC.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an MDAC of a pipelined ADC. On account of that some or all elements of the MDAC could be known, the detail of such elements is omitted provided that such detail has little to do with the features of this disclosure and this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 4:
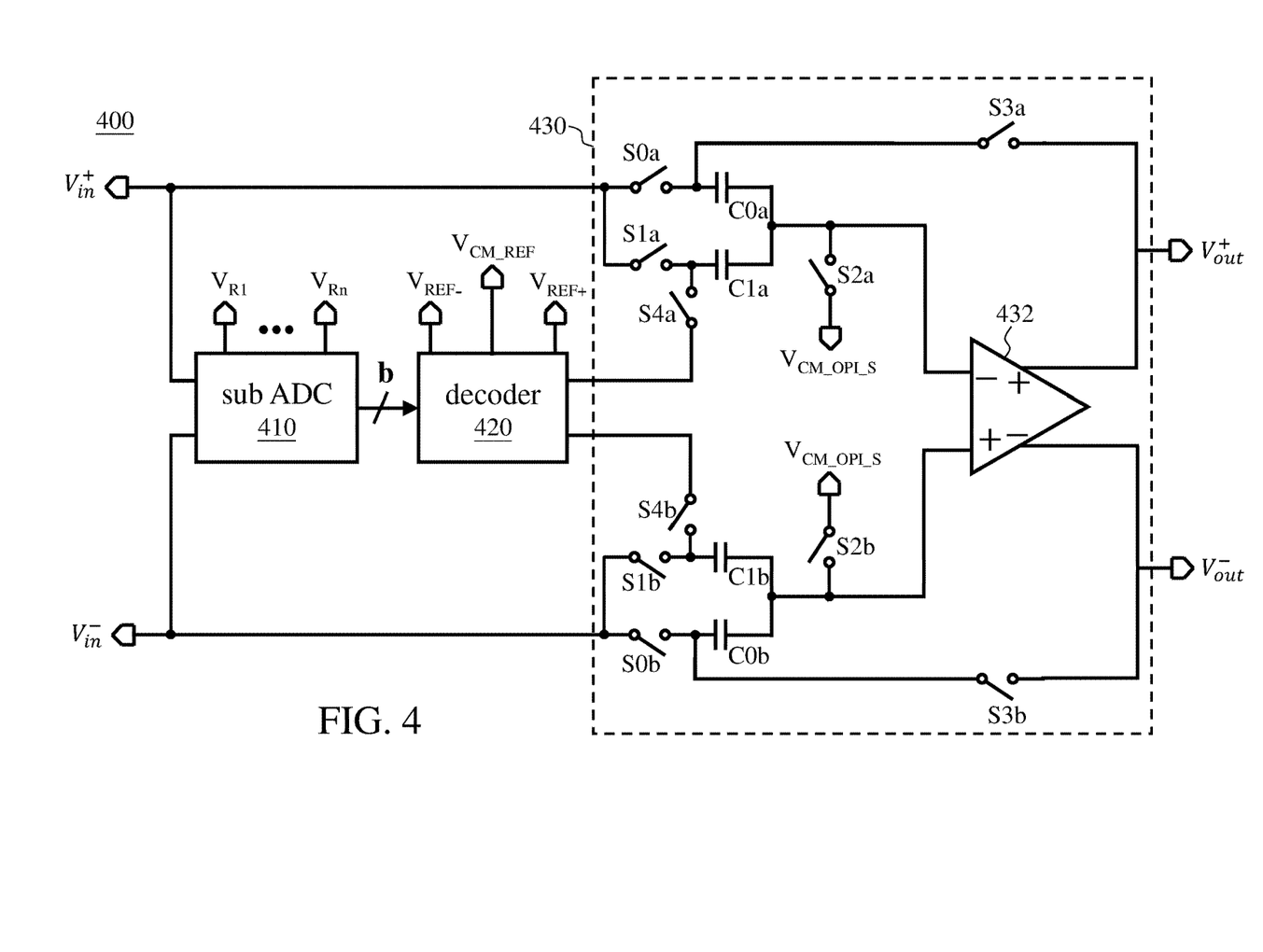
FIG. 4 illustrates a circuit diagram of one operational stage of a 1.5-bit pipelined ADC according to an embodiment of the present invention.
Figure 5A:
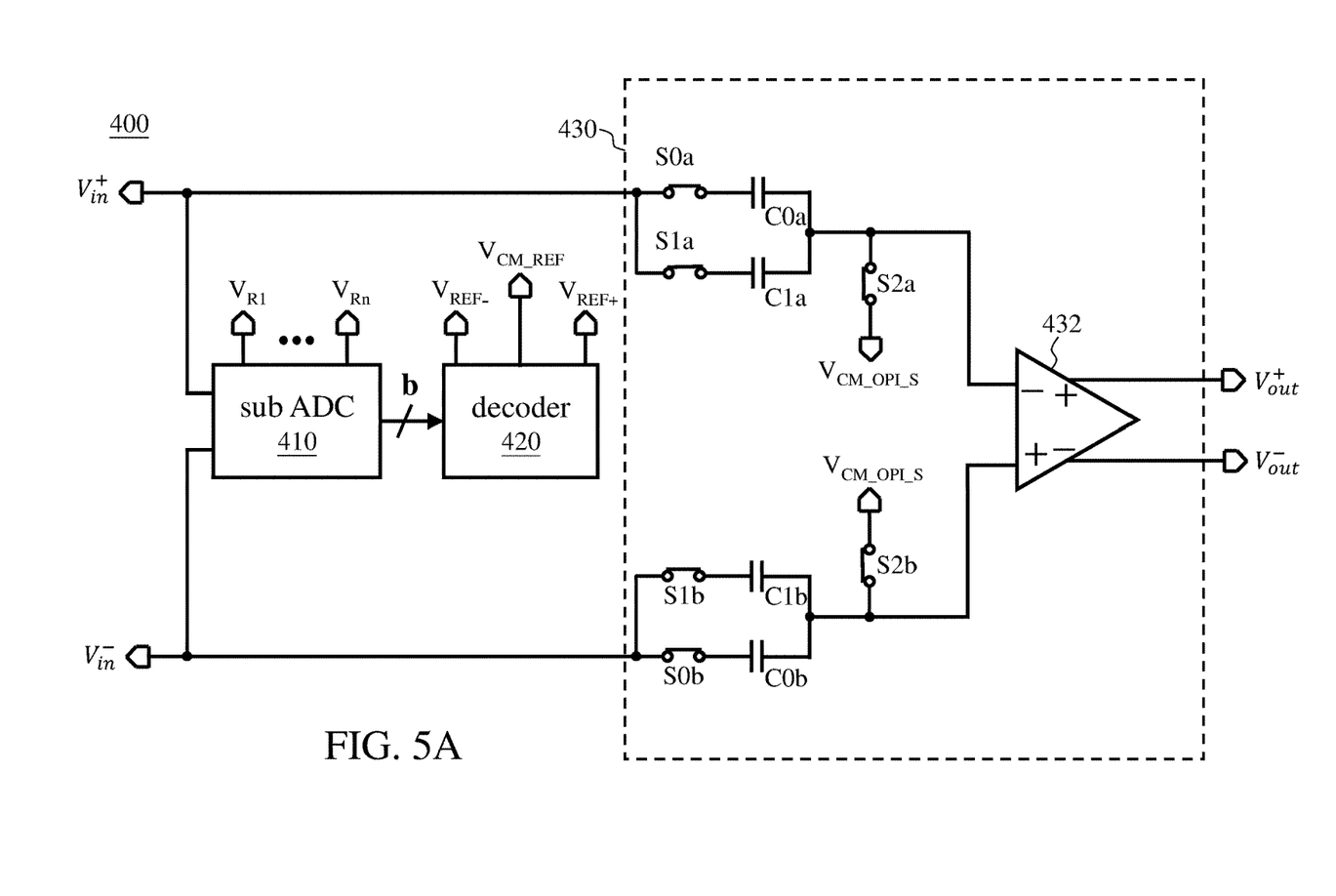
FIG. 5A illustrates a circuit diagram of the pipelined ADC of FIG. 4 operating in the sampling phase.
Figure 5B:
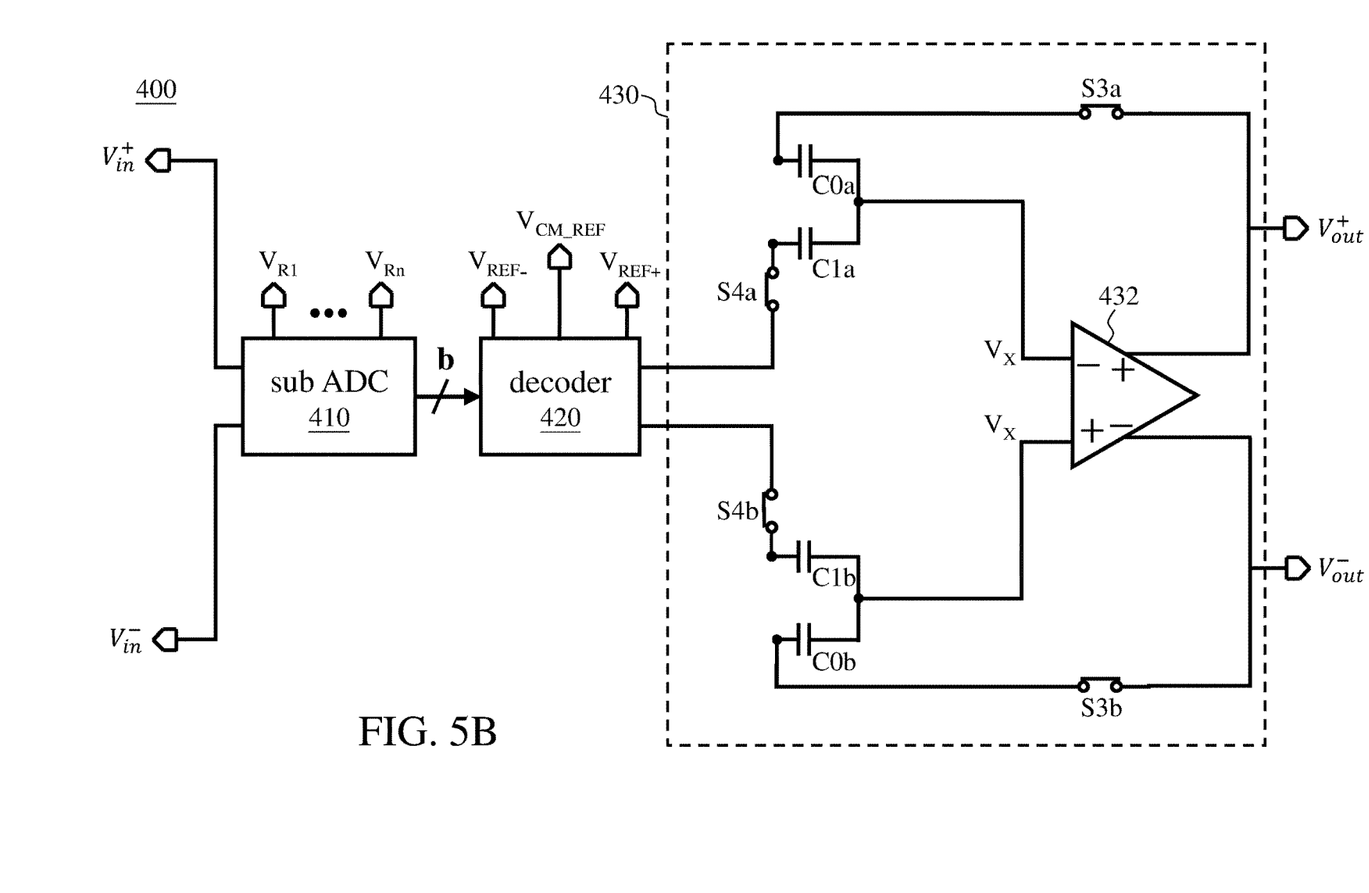
FIG. 5B illustrates a circuit diagram of the pipelined ADC of FIG. 4 operating in the amplification phase.

FIG. 4 is a circuit diagram of one operational stage of a 1.5-bit pipelined ADC according to an embodiment of the present invention. The differential input signal $V_{in}$ (including the signals $V_{in}^+$ and $V_{in}^-$) can be the output of a previous stage of the pipelined ADC (e.g., a programmable gain amplifier (PGA)) or the output of a previous operational stage that the current operational stage follows. The operational stage 400 includes a sub ADC 410, a decoder 420, and an MDAC 430. The operation principles of the sub ADC 410 and the decoder 420 are respectively the same as or similar to those of the conventional sub ADC 112 and decoder 114 and thus omitted for brevity. The MDAC 430 includes an operational amplifier 432, capacitors C0a, C1a, C0b, C1b, switches S0a to S4a, and switches S0b to S4b. The capacitance values of the capacitors C0a, C1a, C0b, and C1b are substantially the same. The MDAC 430 operates alternately in the sampling phase and the amplification phase. In the sampling phase, the switches S0a, S1a, S2a, S0b, S1b, S2b are turned on, and the remaining switches are turned off (FIG. 5A). In the amplification phase, the switches S3a, S4a, S3b, S4b are turned on, and the remaining switches are turned off (FIG. 5B). As shown in FIG. 5B, the DC voltage of the input terminals of the operational amplifier 432 in the amplification phase are $V_X$.

One end of the capacitor C0a (or C0b) is coupled to the reference voltage $V_{CM\_OPI\_S}$ through the switch S2a (or S2b) in the sampling phase, and is coupled to an input terminal of the operational amplifier 432 but not to the reference voltage $V_{CM\_OPI\_S}$ in the amplification phase; the other end of the capacitor C0a (or C0b) receives the input signal $V_{in}^+$ (or $V_{in}^-$) through the switch S0a (or S0b) in the sampling phase, and is coupled to the non-inverting output (or inverting output) of the operational amplifier 432 through the switch S3a (or S3b) in the amplification phase.

One end of the capacitor C1a (or C1b) is coupled to the reference voltage $V_{CM\_OPI\_S}$ through the switch S2a (or S2b) in the sampling phase, and is coupled to an input terminal of the operational amplifier 432 but not to the reference voltage $V_{CM\_OPI\_S}$ in the amplification phase; the other end of the capacitor C1a (or C1b) receives the input signal $V_{in}^+$ (or $V_{in}^-$) through the switch S1a (or S1b) in the sampling phase, and receives the output voltage of the decoder 420 through the switch S4a (or S4b) in the amplification phase.

The decoder 420 outputs the reference voltage $V_{REF+}$, the reference voltage $V_{REF-}$, and/or the voltage $V_{CM\_REF}$ according to the digital signal b. For example, in a certain amplification phase, the decoder 420 outputs the reference voltage $V_{REF+}$ to the capacitor C1a through the switch S4a and outputs the reference voltage $V_{REF-}$ to the capacitor C1b through the switch S4b; in another amplification phase, the decoder 420 outputs the voltage $V_{CM\_REF}$ to the capacitor C1a through the switch S4a and to the capacitor C1b through the switch S4b.

According to the principle of charge conservation, for all capacitors coupled to one of the input terminals of operational amplifier 432 (i.e., capacitors C0a and C1a or capacitors C0b and C1b), the total charge stored in the sampling phase should ideally be equal to the total charge stored in the amplification phase, which gives the derivation below. Note that the above reference voltage $V_{CM\_OPI\_S}$ corresponds to the situation in which the voltage $V_{CM\_REF}$ is not equal to the voltage $V_{CM\_PGA}$, and, in the following equations demonstrating the derivation of the DC voltage $V_X$, the reference voltage $V_{CM\_OPI\_S}$ is temporarily replaced by the voltage $V_{CM\_OPI}$, which corresponds to the situation in which the voltage $V_{CM\_REF}$ is substantially equal to the voltage $V_{CM\_PGA}$.

$$(V_{CM\_PGA} - V_{CM\_OPI})NC = (N-1)C(V_{CM\_REF} - V_X) + (V_{CM\_OPO} - V_X)C$$

$$NV_{CM\_PGA} - NV_{CM\_OPI} = (N-1)V_{CM\_REF} - (N-1)V_X + V_{CM\_OPO} - V_X$$

$$NV_{CM\_PGA} - NV_{CM\_opi} = (N-1)V_{CM\_REF} - NV_X + V_{CM\_OPO}$$

$$V_X = \frac{(N-1)V_{CM\_REF} - NV_{CM\_PGA} + NV_{CM\_OPI} + V_{CM\_OPO}}{N}$$

In these equations, C is the capacitance value of the capacitors C0a, C1a, C0b, C1b, $V_{CM\_PGA}$ is the common-mode voltage of the differential input signal $V_{in}$, N is the number of capacitors coupled to one of the input terminals of the operational amplifier 432 ($N=2^P$, P being the integer part of the number of bits of the pipelined ADC), and $V_{CM\_OPO}$ is the common-mode voltage of the differential output signal $V_{out}$ (including the output signals $V_{out}^+$ and $V_{out}^-$).

When the common-mode voltage of the reference voltages $V_{REF+}$ and $V_{REF-}$ is substantially equal to the common-mode voltage of the differential input signal $V_{in}$ (i.e., when the voltage $V_{CM\_REF}$ is substantially equal to the voltage $V_{CM\_PGA}$), the voltage $V_{CM\_OPO}$ is ideally also substantially equal to the voltages $V_{CM\_REF}$ and $V_{CM\_PGA}$, which gives the equations below.

$$V_X = \frac{(N-1)V_{CM\_REF} - (N-1)V_{CM\_PGA} + NV_{CM\_OPI}}{N}$$

$$V_X = \frac{NV_{CM\_OPI}}{N} = V_{CM\_OPI}$$

It can be observed from the above derivation that when the voltage $V_{CM\_REF}$ is substantially equal to the voltage $V_{CM\_PGA}$, the DC voltage $V_X$ of the input terminal of the operational amplifier 432 in the amplification phase is substantially equal to the reference voltage $V_{CM\_OPI}$.

When the voltage $V_{CM\_REF}$ is deliberately controlled to be not equal to the voltage $V_{CM\_PGA}$ for the purpose of increasing the design flexibility of the MDAC 430, the following equation is obtained (assuming that $V_{CM\_PGA} = \Delta V_{CM} + V_{CM\_REF}$ and that the voltage $V_{CM\_OPO}$ is still substantially equal to $V_{CM\_PGA}$):

$$V_X = \frac{-(N-1)}{N}\Delta V_{CM} + V_{CM\_OPI}$$

This equation shows that if a voltage level shift of $$\frac{N-1}{N}\Delta V_{CM}$$

is applied to the reference voltage $V_{CM\_OPI}$, the DC voltage $V_X$ of the input terminal of the operational amplifier 432 in the amplification phase will substantially not be affected even though the voltage $V_{CM\_REF}$ is altered to be not equal to the voltage $V_{CM\_PGA}$; that is, the DC voltage $V_X$ will still be substantially equal to the originally designed reference voltage $V_{CM\_OPI}$. In other words, when the voltage $V_{CM\_REF}$ is substantially equal to the voltage $V_{CM\_PGA}$, the DC voltage $V_X$ of the input terminal of the operational amplifier 432 in the amplification phase is substantially equal to the reference voltage $V_{CM\_OPI}$; when, on the other hand, the voltage $V_{CM\_REF}$ is not equal to the voltage $V_{CM\_PGA}$, this invention applies a voltage level shift of $$\frac{N-1}{N}\Delta V_{CM}$$

to the reference voltage $V_{CM\_OPI}$, and, therefore, the shifted reference voltage $$V_{CM\_OPI\_S} = V_X + \frac{N-1}{N}\Delta V_{CM}$$

will cause the DC voltage $V_X$ of the input terminal of the operational amplifier 432 in the amplification phase is still substantially equal to the original reference voltage $V_{CM\_OPI}$. The above discussion explains that in the embodiment of FIG. 4, the DC voltage $V_X$ of the input terminal of the operational amplifier 432 in the amplification phase is not equal to the reference voltage $V_{CM\_OPI\_S}$. By creating a voltage difference of $$\frac{N-1}{N}\Delta V_{CM}$$

between the reference voltage $V_{CM\_OPI\_S}$ and the DC voltage $V_X$, the operational amplifier 432 is less affected by the fact that the voltage $V_{CM\_REF}$ is not equal to the voltage $V_{CM\_PGA}$.

With the circuit design of FIG. 4, the common-mode voltage $V_{CM\_REF}$ of the reference voltage $V_{REF+}$ and the reference voltage $V_{REF-}$ can be arbitrary, rather than having to be substantially equal to the common-mode voltage $V_{CM\_PGA}$ of the differential input signal $V_{in}$. As a result, in some embodiments, the reference voltage $V_{REF-}$ can be shifted to ground. For example, the reference voltage $V_{REF+}$, the common-mode voltage $V_{CM\_REF}$, and the reference voltage $V_{REF-}$ can be shifted from 0.75VDD, 0.5VDD, and 0.25VDD to 0.5VDD, 0.25VDD, and 0, respectively, and the difference between the voltage $V_{REF+}$ and the common-mode voltage $V_{CM\_REF}$ and the difference between the reference voltage $V_{REF-}$ and the common-mode voltage $V_{CM\_REF}$ remain substantially unchanged (i.e., 0.25 VDD). Setting the reference voltage $V_{REF-}$ to ground has the following advantages: (1) a unity gain buffer is saved to effectively reduce the circuit area; (2) ground provides a greater driving capability than any electric potential other than ground.

Figure 6:
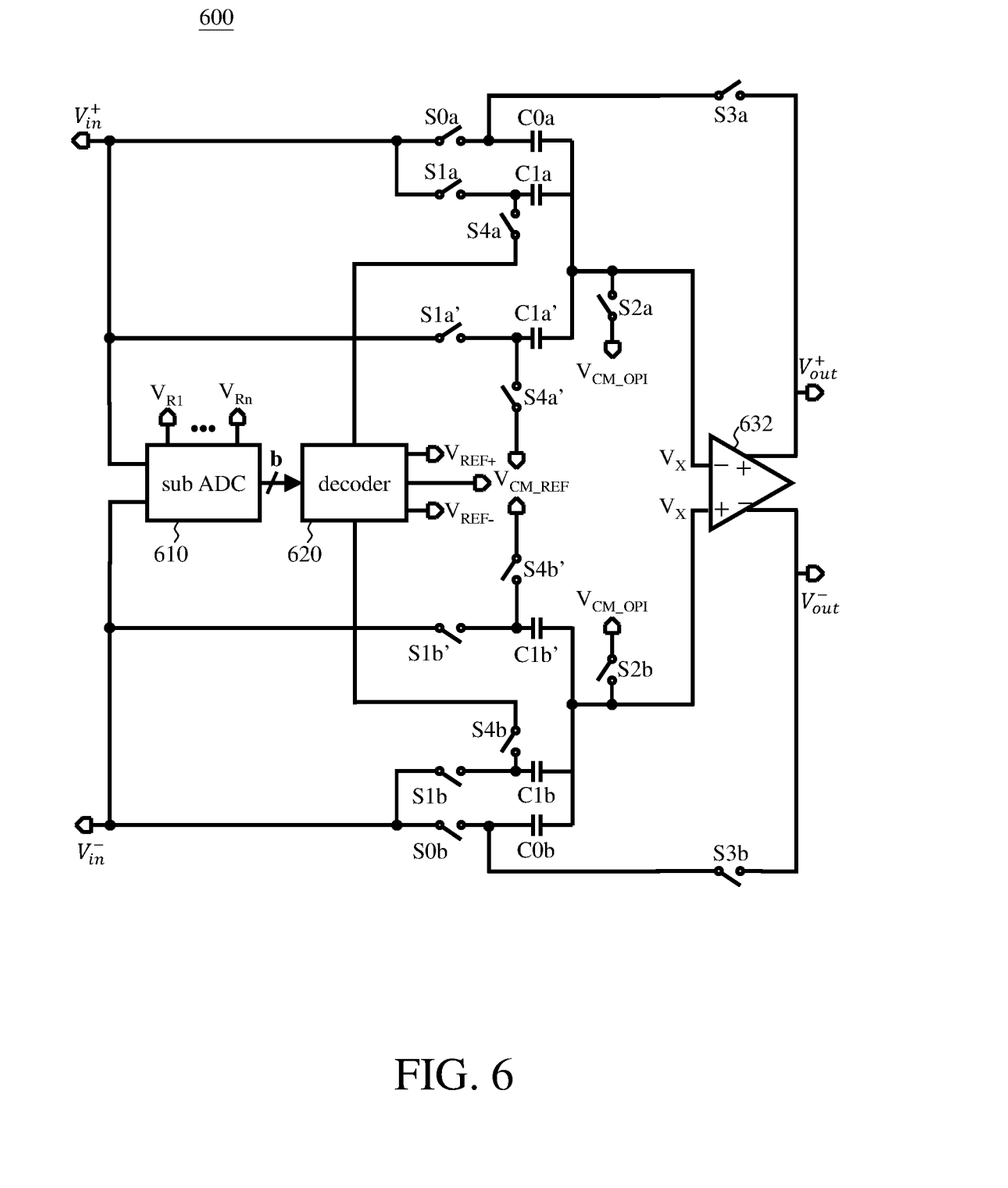
FIG. 6 illustrates a circuit diagram of one operational stage of a 1.5-bit pipelined ADC according to another embodiment of the present invention.

FIG. 6 is a circuit diagram of one operational stage of a 1.5-bit pipelined ADC according to another embodiment of the present invention. The operational stage 600 includes a sub ADC 610, a decoder 620, and an MDAC. The MDAC is the circuit besides the sub ADC 610 and the decoder 620. The operations of the sub ADC 610 and the decoder 620 are the same as or similar to those of the conventional sub ADC 112 and decoder 114, respectively, and are thus omitted for brevity. The MDAC includes an operational amplifier 632, capacitors C0a, C1a, C1a', C0b, C1b, C1b', switches S0a to S4a, S1a', S4a', and switches S0b to S4b, S1b', and S4b'. The capacitance values of the capacitor C0a and the capacitor C0b are substantially the same. The MDAC operates alternately in the sampling phase and the amplification phase. In the sampling phase, the switches S0a, S1a, S1a', S2a, S0b, S1b, S1b', S2b are turned on, and the remaining switches are turned off. In the amplification phase, the switches S3a, S4a, S4a', S3b, S4b, S4b' are turned on, and the remaining switches are turned off.

The connections and operations of the capacitors C0a, C0b, C1a, C1b are similar to the capacitors C0a, C0b, C1a, C1b of FIG. 4, respectively. In this embodiment, however, the reference voltage $V_{CM\_OPI}$ is substantially equal to the DC voltage $V_X$ of the input terminal of the operational amplifier 632 in the amplification phase because the voltage $V_{CM\_REF}$ is substantially equal to the voltage $V_{CM\_PGA}$ (i.e., the voltage $V_{CM\_REF}$ is not shifted).

One end of the capacitor C1a' (or C1b') is coupled to the reference voltage $V_{CM\_OPI}$ through the switch S2a (or S2b) in the sampling phase, and is coupled to an input terminal of the operational amplifier 632 but not to the reference voltage $V_{CM\_OPI}$ in the amplification phase; the other end of the capacitor C1a' (or C1b') receives the input signal $V_{in}^+$ (or $V_{in}^-$) through the switch S1a' (or S1b') in the sampling phase, and receives the common-mode voltage $V_{CM\_REF}$ of the reference voltage $V_{REF+}$ and the reference voltage $V_{REF-}$ through the switch S4a' (or S4b') in the amplification phase.

In this embodiment, the reference voltage $V_{REF+}$ and the reference voltage $V_{REF-}$ do not necessarily satisfy $V_{REF+} - V_{REF-} = 0.5V_{pp\_max}$ ($V_{pp\_max}$ is the allowed maximum peak-to-peak value of the differential input signal $V_{in}$), but the common-mode voltage $V_{CM\_REF}$ of the reference voltage $V_{REF+}$ and the reference voltage $V_{REF-}$ is still substantially equal to the common-mode voltage $V_{CM\_PGA}$ of the differential input signal $V_{in}$. For example, if the differential input signal $V_{in}$ is limited between VDD and ground (i.e., $V_{pp\_max}$=VDD−0=VDD), then the difference between the voltages $V_{REF+}$ and $V_{REF-}$ can be designed to be equal to $V_{pp\_max}$=VDD (e.g., $V_{REF+}$=VDD and $V_{REF-}$=0), and $V_{CM\_REF}$ is still substantially equal to $V_{CM\_PGA}$=0.5VDD. In this embodiment, since the common-mode voltage $V_{CM\_REF}$ of the reference voltage $V_{REF+}$ and the reference voltage $V_{REF-}$ is still substantially equal to the common-mode voltage $V_{CM\_PGA}$ of the differential input signal $V_{in}$, the reference voltage $V_{CM\_OPI}$ is substantially equal to the DC voltage $V_X$ of the input terminal of the operational amplifier 632 in the amplification phase.

In response to the changes in the reference voltage $V_{REF+}$ and the reference voltage $V_{REF-}$, the capacitance values of the capacitors C1a, C1a', C1b, and C1b' need to be adjusted accordingly. The sum of the capacitance values of the capacitors C1a (or C1b) and C1a' (or C1b') is substantially equal to the capacitance value of the capacitor C0a (or C0b). The ratio of the capacitance value of the capacitor C1a to that of the capacitor C1a' (or C1b to C1b') is related to $(V_{REF+} - V_{REF-})/V_{pp\_max}$. More specifically, if the capacitance value of the capacitor C0a (or C0b) is C, the capacitance value of the capacitor C1a (or C1b) is XC (0<X<1), and the capacitance value of the capacitor C1a' (or C1b') is YC (0<Y<1), then X+Y is substantially equal to 1, and X=0.5×$V_{pp\_max}$/($V_{REF+} - V_{REF-}$). That is, when ($V_{REF+} - V_{REF-}$) is R times $V_{pp\_max}$, X=½R. In one example, when $V_{pp\_max}$ VDD−0=VDD, $V_{REF+}$=VDD, and $V_{REF-}$=0 ($V_{CM\_REF}$ (VDD+0)/2=0.5VDD=$V_{CM\_PGA}$), R=(VDD−0)/VDD=1, X=½R=0.5, and Y=1−X=0.5. In another example, when $V_{pp\_max}$=VDD−0=VDD, $V_{REF+}$=0.9VDD, and $V_{REF-}$= 0.1VDD ($V_{CM\_REF}$=(0.9VDD+0.1VDD)/2=0.5VDD=$V_{CM\_PGA}$), R=(0.9VDD−0.1VDD)/VDD=0.8, X=½R=0.625, and Y=1−X=0.325.

With the circuit design of FIG. 6, the difference between the reference voltage $V_{REF+}$ and the reference voltage $V_{REF-}$ can be arbitrary, rather than having to be substantially equal to 0.5 times the allowed maximum peak-to-peak value $V_{pp\_max}$ of the differential input signal $V_{in}$. Therefore, in some embodiments, the reference voltage $V_{REF-}$ can be scaled to ground.

In summary, in order to increase the design flexibility of the MDAC or the pipelined ADC employing same, the present invention proposes the embodiments of FIG. 4 and FIG. 6 that respectively enable shift and scaling of the reference voltage ($V_{REF+}$ and $V_{REF-}$) for the MDAC. When one of the reference voltages is shifted or scaled to ground, a unity gain buffer can be omitted to thereby effectively reduce the circuit area.

Figure 7:
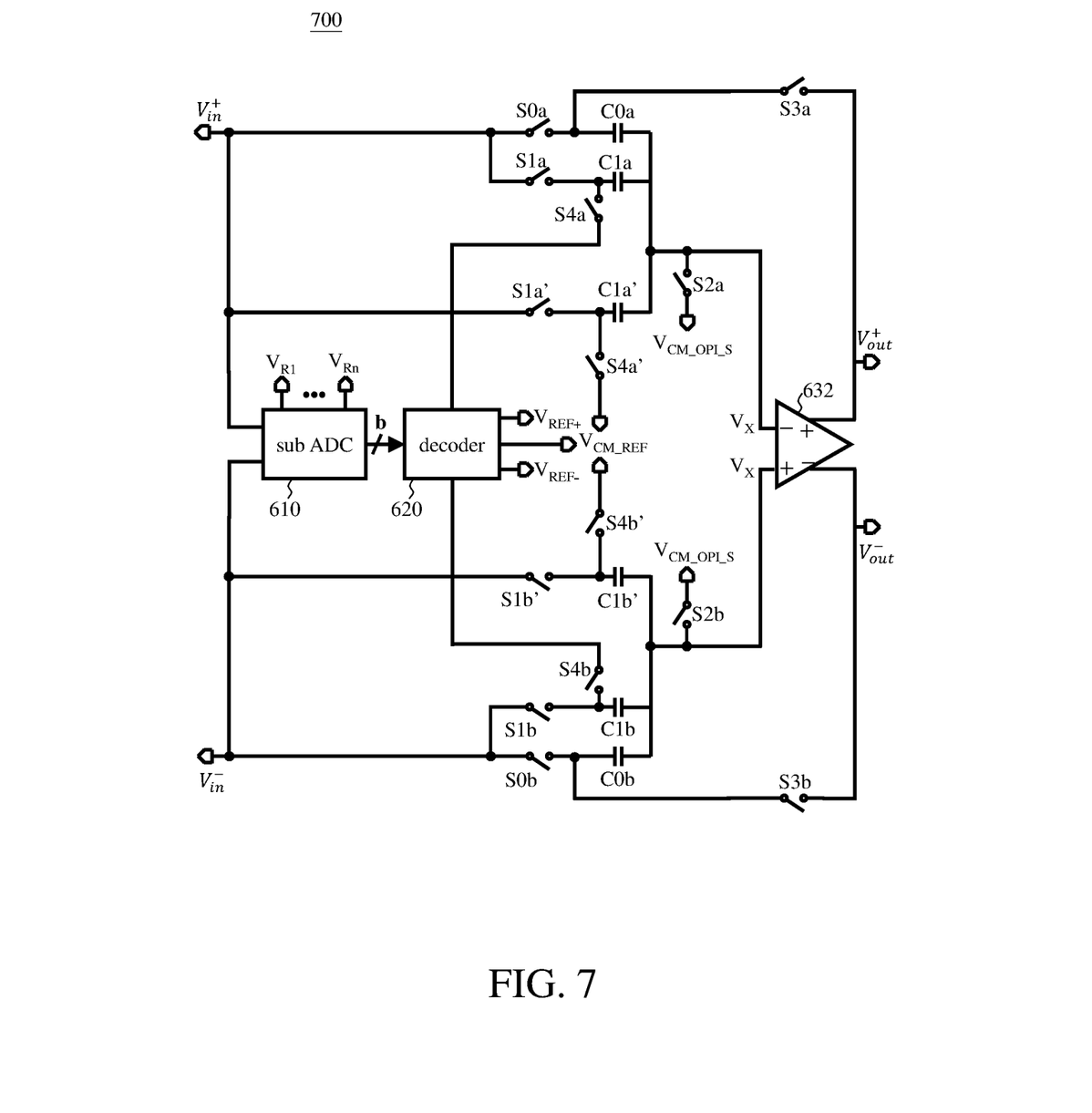
FIG. 7 illustrates a circuit diagram of one operational stage of a 1.5-bit pipelined ADC according to another embodiment of the present invention.

The foregoing voltage level shift and scaling operations can be implemented at the same time, and FIG. 7 shows the embodied circuit. The circuit and operation of the operational stage 700 are similar to the operational stage 600, except that the reference voltage $V_{CM\_OPI}$ to which the capacitor in FIG. 6 couples in the sampling phase is substantially equal to the DC voltage $V_X$ of the input terminal of the operational amplifier 632 in the amplification phase, whereas the reference voltage $V_{CM\_OPI\_S}$ to which the capacitor in FIG. 7 couples in the sampling phase is not equal to the DC voltage $V_X$ of the input terminal of the operational amplifier 632 in the amplification phase. The reference voltage $V_{CM\_OPI\_S}$ can be designed as $$V_{CM\_OPI\_S} = V_X + \frac{N-1}{N}\Delta V_{CM},$$

where $\Delta V_{CM}$ $V_{CM\_PGA}$-$V_{CM\_REF}$.

Figure 8:
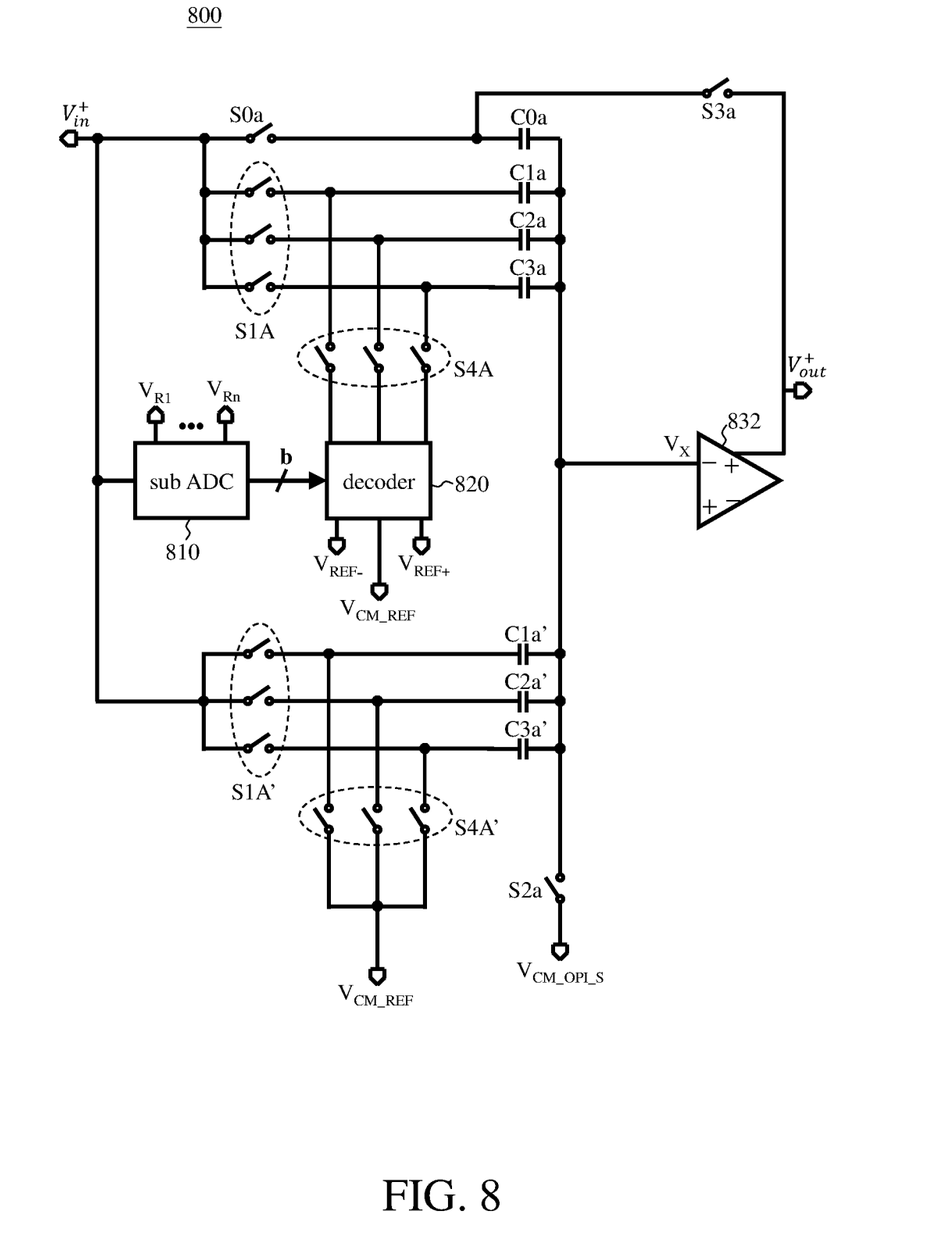
FIG. 8 illustrates a circuit diagram of one operational stage of a 2.5-bit pipelined ADC according to an embodiment of the present invention.

FIG. 8 is a circuit diagram of one operational stage of a 2.5-bit pipelined ADC according to another embodiment of the present invention. The operational stage 800 includes a sub ADC 810, a decoder 820, and an MDAC. The MDAC is the circuit besides the sub ADC 810 and the decoder 820. The operations of the sub ADC 810 and decoder 820 are the same as or similar to those of the conventional sub ADC 112 and decoder 114, respectively, and are thus omitted for brevity. The MDAC operates alternately in the sampling phase and the amplification phase. FIG. 8 depicts only a part of the MDAC, that is, the partial circuit coupled to one of the input terminals of the operational amplifier 832. Those skilled in the art can understand the circuitry of the rest of the MDAC of FIG. 8 based on the disclosures of FIG. 6 to FIG. 8. Based on the disclosures of FIG. 6 to FIG. 8, those skilled in the art can also understand the circuit and operation details when the present invention is applied to a higher-order pipelined ADC.

In comparison with the operational stages 600 and 700, the operational stage 800 further includes capacitors C2a, C2a', C3a, C3a', and capacitors C2b, C2b', C3b, C3b' (not shown). The capacitors C2b, C2b', C3b, C3b' are coupled to the other input terminal of the operational amplifier 832. The capacitors C1a to C3a (or C1b to C3b, not shown) receive the input signal $V_{in}^+$ (or $V_{in}^-$, not shown) through the switch group S1A (or S1B, not shown), and receive the output voltage(s) of the decoder 820 through the switch group S4A (or S4B, not shown). The capacitor C1a' to C3a' (or C1b' to C3b', not shown) receives the input signal $V_{in}^+$ (or $V_{in}^-$, not shown) through the switch group S1A' (or S1B', not shown), and coupled to the common-mode voltage $V_{CM\_REF}$ of the reference voltage $V_{REF+}$ and the reference voltage $V_{REF-}$ through the switch group S4A' (or S4B', not shown). The capacitors C1a to C3a and C1a' to C3a (or C1b to C3b and C1b' to C3b', not shown) are coupled to the reference voltage $V_{CM\_OPI\_S}$ through the switch S2a (or S2b, not shown). The three switches in each of the switch groups S1A, S1A', S4A, S4A' (or S1B, S1B', S4B, S4B', not shown) are simultaneously turned on or off, and the switching operations of the switch groups S1A, S1A', S4A, S4A' (or S1B, S1B', S4B, S4B', not shown) are the same as those of the switches S1a, S1a', S4a, S4a (or S1b, S1b', S4b, S4b') of FIG. 6 and FIG. 7, respectively, and thus omitted for brevity.

If the capacitance value of the capacitor C0a is C, the capacitance value of the capacitor C1a is XC (0<X<1), and the capacitance value of the capacitor C1a' is YC (0<Y<1), then X+Y is substantially equal to 1, and X=0.5×$V_{pp\_max}$/($V_{REF+}$-$V_{REF-}$). The same applies to the capacitor pairs (C2a, C2a) and (C3a, C3a'). When the voltage $V_{CM\_REF}$ is substantially equal to the voltage $V_{CM\_PGA}$, the DC voltage $V_X$ of the input terminal of the operational amplifier 832 in the amplification phase is substantially equal to the reference voltage $V_{CM\_OPI\_S}$. When the voltage $V_{CM\_REF}$ is not equal to the voltage $V_{CM\_PGA}$, the DC voltage $V_X$ of the input terminal of the operational amplifier 832 in the amplification phase is not equal to the reference voltage $V_{CM\_OPI\_S}$, that is, $$V_{CM\_OPI\_S} = V_X + \frac{N-1}{N}\Delta V_{CM},$$

where $\Delta V_{CM}$=$V_{CM\_PGA}$-$V_{CM\_REF}$ and N=4 for a 2.5-bit pipelined ADC. In one embodiment, the reference voltage $V_{REF-}$ may be ground.

Since a person having ordinary skill in the art can appreciate the implementation detail and the modification thereto of the present method invention through the disclosure of the device invention, repeated and redundant description is thus omitted. Furthermore, the shape, size, and ratio of any element in the disclosed figures are exemplary for understanding, not for limiting the scope of this invention. In addition, although the foregoing embodiments are exemplified by a 1.5-bit or 2.5-bit pipelined ADC, the present invention is not limited thereto. Those skilled in the art can apply the present invention to other pipelined ADCs of different bits according to the disclosure of the present invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A multiplying digital-to-analog converter (MDAC) applied to a pipelined analog-to-digital converter (ADC) and operating in a sampling phase or an amplification phase, comprising:
   an operational amplifier;
   a first capacitor having a first end and a second end, wherein the first end is coupled to a first reference voltage in the sampling phase and coupled to a first input terminal of the operational amplifier but not to the first reference voltage in the amplification phase, wherein the second end receives a differential input signal in the sampling phase and is coupled to a first output terminal of the operational amplifier in the amplification phase;
   a second capacitor having a third end and a fourth end, wherein the third end is coupled to the first reference voltage in the sampling phase and coupled to the first input terminal of the operational amplifier but not to the first reference voltage in the amplification phase, wherein the fourth end receives the differential input signal in the sampling phase and is coupled to a second reference voltage in the amplification phase;

a third capacitor having a fifth end and a sixth end, wherein the fifth end is coupled to the first reference voltage in the sampling phase and coupled to a second input terminal of the operational amplifier but not to the first reference voltage in the amplification phase, wherein the sixth end receives the differential input signal in the sampling phase and is coupled to a second output terminal of the operational amplifier in the amplification phase; and a fourth capacitor having a seventh end and an eighth end, wherein the seventh end is coupled to the first reference voltage in the sampling phase and coupled to the second input terminal of the operational amplifier but not to the first reference voltage in the amplification phase, wherein the eighth end receives the differential input signal in the sampling phase and is coupled to a third reference voltage in the amplification phase;

wherein one of the second reference voltage and the third reference voltage is substantially ground.

2. The MDAC of claim 1, wherein the DC voltages of the first and second input terminals of the operational amplifier in the amplification phase are not substantially equal to the first reference voltage.

3. The MDAC of claim 2, wherein the common-mode voltage of the differential input signal is a first voltage, the common-mode voltage of the second reference voltage and the third reference voltage is a second voltage, and a difference between the first reference voltage and the DC voltage of the first or second input terminal of the operational amplifiers in the amplification phase is substantially equal to $(N-1)/N$ times the difference between the first voltage and the second voltage, and N is a positive integer.

4. The MDAC of claim 3, wherein N is equal to $2^P$, and P is the integer part of the number of bits of the pipelined ADC.

5. The MDAC of claim 1 further comprising:
a fifth capacitor having a ninth end and a tenth end, wherein the ninth end is coupled to the first reference voltage in the sampling phase and coupled to the first input terminal of the operational amplifier but not to the first reference voltage in the amplification phase, wherein the tenth end receives the differential input signal in the sampling phase and is coupled to a common-mode voltage of the second reference voltage and the third reference voltage in the amplification phase; and a sixth capacitor having an eleventh end and a twelfth end, wherein the eleventh end is coupled to the first reference voltage in the sampling phase, and is coupled to the second input terminal of the operational amplifier but not to the first reference voltage in the amplification phase, wherein the twelfth end receives the differential input signal in the sampling phase and is coupled to the common-mode voltage in the amplification phase.

6. The MDAC of claim 5, wherein the capacitance value of the second capacitor is X times the capacitance value of the first capacitor, the capacitance value of the fifth capacitor is Y times the capacitance value of the first capacitor, and the sum of X and Y is substantially one.

7. The MDAC of claim 6, wherein the difference between the second reference voltage and the third reference voltage is a first voltage difference, and when the first voltage difference is substantially R times an allowed maximum peak-to-peak value of the differential input signal, X is equal to ½R, R being a positive number.

8. The MDAC of claim 5, wherein the difference between the second reference voltage and the third reference voltage is not substantially equal to half of an allowed maximum peak-to-peak value of the differential input signal.

9. A multiplying digital-to-analog converter (MDAC) applied to a pipelined analog-to-digital converter (ADC) and operating in a sampling phase or an amplification phase, comprising:
an operational amplifier
a first capacitor having a first end and a second end, wherein the first end is coupled to a first reference voltage in the sampling phase and coupled to a first input terminal of the operational amplifier but not to the first reference voltage in the amplification phase, wherein the second end receives a differential input signal in the sampling phase and is coupled to a first output terminal of the operational amplifier in the amplification phase;

a second capacitor having a third end and a fourth end, wherein the third end is coupled to the first reference voltage in the sampling phase and coupled to the first input terminal of the operational amplifier but not to the first reference voltage in the amplification phase, wherein the fourth end receives the differential input signal in the sampling phase and is coupled to a second reference voltage in the amplification phase;

a third capacitor having a fifth end and a sixth end, wherein the fifth end is coupled to the first reference voltage in the sampling phase and coupled to a second input terminal of the operational amplifier but not to the first reference voltage in the amplification phase, wherein the sixth end receives the differential input signal in the sampling phase and is coupled to a second output terminal of the operational amplifier in the amplification phase; and a fourth capacitor having a seventh end and an eighth end, wherein the seventh end is coupled to the first reference voltage in the sampling phase and coupled to the second input terminal of the operational amplifier but not to the first reference voltage in the amplification phase, wherein the eighth end receives the differential input signal in the sampling phase and is coupled to a third reference voltage in the amplification phase;

wherein the DC voltages of the first and second input terminals of the operational amplifier in the amplification phase are not substantially equal to the first reference voltage.

10. The MDAC of claim 9, wherein the common-mode voltage of the differential input signal is a first voltage, the common-mode voltage of the second reference voltage and the third reference voltage is a second voltage, and a difference between the first reference voltage and the DC voltage of the first or second input terminal of the operational amplifiers in the amplification phase is substantially equal to $(N-1)/N$ times the difference between the first voltage and the second voltage, and N is a positive integer.

11. The MDAC of claim 10, wherein N is equal to $2^P$, and P is the integer part of the number of bits of the pipelined ADC.

12. A multiplying digital-to-analog converter (MDAC) applied to a pipelined analog-to-digital converter (ADC) and operating in a sampling phase or an amplification phase, comprising:
an operational amplifier;
a first capacitor having a first end and a second end, wherein the first end is coupled to a first reference voltage in the sampling phase and coupled to a first input terminal of the operational amplifier but not to the first reference voltage in the amplification phase, wherein the second end receives a differential input signal in the sampling phase and is coupled to a first output terminal of the operational amplifier in the amplification phase;

a second capacitor having a third end and a fourth end, wherein the third end is coupled to the first reference voltage in the sampling phase and coupled to the first input terminal of the operational amplifier but not to the first reference voltage in the amplification phase, wherein the fourth end receives the differential input signal in the sampling phase and is coupled to a second reference voltage in the amplification phase;

a third capacitor having a fifth end and a sixth end, wherein the fifth end is coupled to the first reference voltage in the sampling phase and coupled to a second input terminal of the operational amplifier but not to the first reference voltage in the amplification phase, wherein the sixth end receives the differential input signal in the sampling phase and is coupled to a second output terminal of the operational amplifier in the amplification phase;

a fourth capacitor having a seventh end and an eighth end, wherein the seventh end is coupled to the first reference voltage in the sampling phase and coupled to the second input terminal of the operational amplifier but not to the first reference voltage in the amplification phase, wherein the eighth end receives the differential input signal in the sampling phase and is coupled to a third reference voltage in the amplification phase;

a fifth capacitor having a ninth end and a tenth end, wherein the ninth end is coupled to the first reference voltage in the sampling phase and coupled to the first input terminal of the operational amplifier but not to the first reference voltage in the amplification phase, wherein the tenth end receives the differential input signal in the sampling phase and is coupled to a common-mode voltage of the second reference voltage and the third reference voltage in the amplification phase; and a sixth capacitor having an eleventh end and a twelfth end, wherein the eleventh end is coupled to the first reference voltage in the sampling phase, and is coupled to the second input terminal of the operational amplifier but not to the first reference voltage in the amplification phase, wherein the twelfth end receives the differential input signal in the sampling phase and is coupled to the common-mode voltage in the amplification phase.

13. The MDAC of claim 12, wherein the capacitance value of the second capacitor is X times the capacitance value of the first capacitor, the capacitance value of the fifth capacitor is Y times the capacitance value of the first capacitor, and the sum of X and Y is substantially one.

14. The MDAC of claim 13, wherein the difference between the second reference voltage and the third reference voltage is a first voltage difference, and when the first voltage difference is substantially R times an allowed maximum peak-to-peak value of the differential input signal, X is equal to ½R, R being a positive number.

15. The MDAC of claim 12, wherein the difference between the second reference voltage and the third reference voltage is not substantially equal to half of an allowed maximum peak-to-peak value of the differential input signal.

* * * * *